United States Patent
Jan et al.

(10) Patent No.: US 9,263,281 B2
(45) Date of Patent: Feb. 16, 2016

(54) CONTACT PLUG AND METHOD FOR MANUFACTURING THE SAME

(71) Applicant: VANGUARD INTERNATIONAL SEMICONDUCTOR CORPORATION, Hsinchu (TW)

(72) Inventors: Yi-Tsung Jan, Hsinchu (TW); Peng-Fei Wu, Jhubei (TW); Chih-Ming Kao, Jhubei (TW); You-Cheng Liau, Hsinchu (TW); Wen-Jen Chuang, New Taipei (TW); Rong-Gen Wu, Taichung (TW); Huan-Yu Chien, Taipei (TW); Ting-Yu Kuo, New Taipei (TW); Su-Chen Lin, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/015,538

(22) Filed: Aug. 30, 2013

(65) Prior Publication Data
US 2015/0061082 A1  Mar. 5, 2015

(51) Int. Cl.
*H01L 21/768* (2006.01)
*H01L 23/52* (2006.01)
*H01L 21/285* (2006.01)
*H01L 21/74* (2006.01)

(52) U.S. Cl.
CPC ........ *H01L 21/28518* (2013.01); *H01L 21/743* (2013.01); *H01L 21/76868* (2013.01); *H01L 2924/0002* (2013.01)

(58) Field of Classification Search
USPC .............. 257/382, 621, 751; 438/4, 643, 648, 438/675
IPC ................ H01L 21/76852, 21/76868, 21/76877, H01L 21/76898
See application file for complete search history.

(56) References Cited

U.S. PATENT DOCUMENTS

| | | | |
|---|---|---|---|
| 5,920,122 A * | 7/1999 | Matsumoto et al. | 257/764 |
| 2006/0183327 A1* | 8/2006 | Moon | 438/687 |
| 2010/0171173 A1* | 7/2010 | Hsieh | 257/333 |

* cited by examiner

*Primary Examiner* — Marcos D Pizarro
(74) *Attorney, Agent, or Firm* — Birch, Stewart, Kolasch & Birch, LLP

(57) ABSTRACT

A method for manufacturing a contact plug is provided. The method includes providing a silicon substrate having at least one opening. A titanium layer is conformably formed in the opening. A first barrier layer is conformably formed on the titanium layer in the opening. A rapid thermal process is performed on the titanium layer and the first barrier layer. After performing the rapid thermal process, a second barrier layer is conformably formed on the first barrier layer in the opening.

21 Claims, 2 Drawing Sheets

CONTACT PLUG AND METHOD FOR MANUFACTURING THE SAME

BACKGROUND OF THE INVENTION

1. Field of the Invention

The present invention relates to a manufacturing technique for an integrated circuit device, and more particularly, to a contact plug and a method for manufacturing the same.

2. Description of the Related Art

Trench metal-oxide semiconductor field effect transistors (MOSFETs) are common semiconductor power devices which can withstand high voltage and exhibit low turn-on resistance and high turn-on current. In contrast to planer semiconductor power devices, trench MOSFETs need to form one or more contact plugs in a silicon substrate so as to electrically connect to exterior components. A method for manufacturing the contact plug includes depositing a titanium layer and a titanium nitride layer in an opening so as to prevent conductive materials in the opening from diffusing outward and to provide the conductive materials in the opening with improved adhesion. Next, a rapid thermal process (RTP) is performed such that the titanium layer reacts with the silicon substrate to form a titanium silicide layer, thereby reducing the contact resistance of the contact plug. Next, a conductive layer is deposited to fill in the opening, and the manufacturing process is complete.

In such a method for manufacturing the contact plug, however, during the RTP, the titanium nitride layer is jostled by the titanium layer thereunder due to the different formation rates of the titanium silicide layer at the sidewall and bottom of the opening. Hence, the titanium nitride layer at the bottom corner of the opening may be torn apart and experience cracking. The conductive materials in the opening may thus diffuse outward via the cracks, resulting in leakage paths of the transistors and thereby increasing leakage current. Moreover, if the method utilizes gases containing fluorine (for example, $WF_6$), fluorine ions may also pass through the cracks and react with the silicon substrate, thereby resulting in Si loss near the bottom corner of the contact plug.

Therefore, a novel contact plug and a method for manufacturing the same are desired to solve or mitigate the aforementioned problems.

BRIEF SUMMARY OF INVENTION

A detailed description is given in the following embodiments with reference to the accompanying drawings. A contact plug and a method for manufacturing the same are provided.

An exemplary embodiment of a method for manufacturing a contact plug includes providing a silicon substrate having at least one opening. A titanium layer is conformably formed in the opening. A first barrier layer is conformably formed on the titanium layer in the opening. A rapid thermal process is performed on the titanium layer and the first barrier layer. A second barrier layer is conformably formed on the first barrier layer in the opening after performing the rapid thermal process.

An exemplary embodiment of a contact plug includes a silicon substrate having at least one opening. A titanium layer is conformably formed in the opening. A first barrier layer is conformably formed on the titanium layer in the opening. A second barrier layer is conformably formed on the first barrier layer in the opening.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1A:
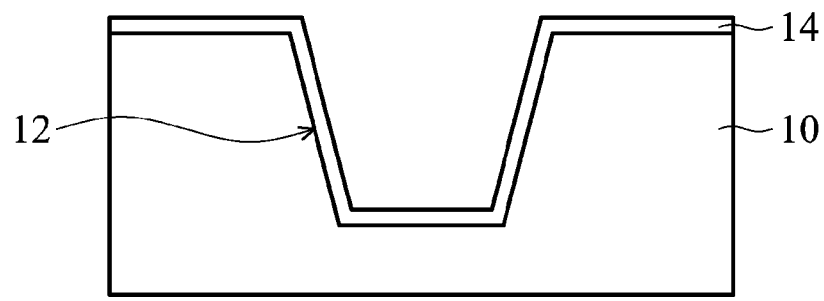
FIGS. 1A to 1E are cross sections of an exemplary embodiment of a method for manufacturing a contact plug according to the invention.
Figure 1B:
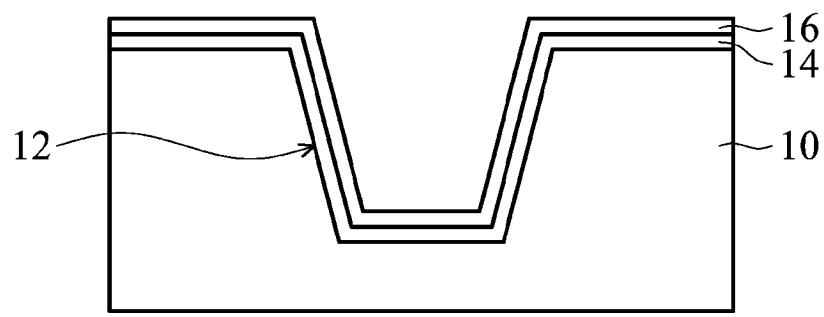
Figure 1C:
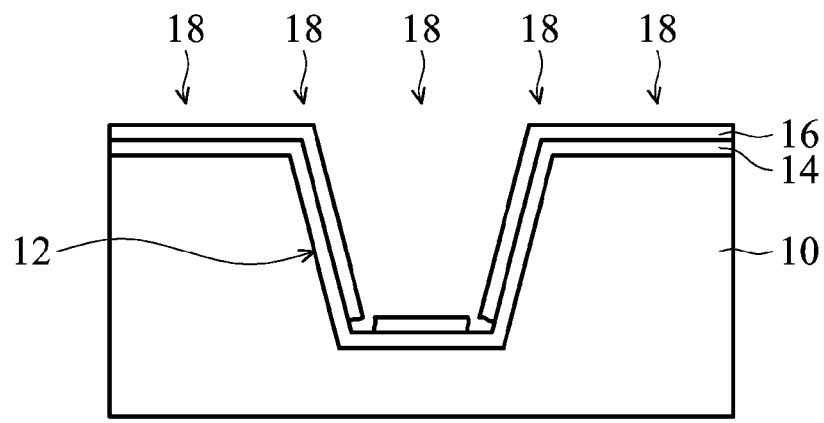
Figure 1D:
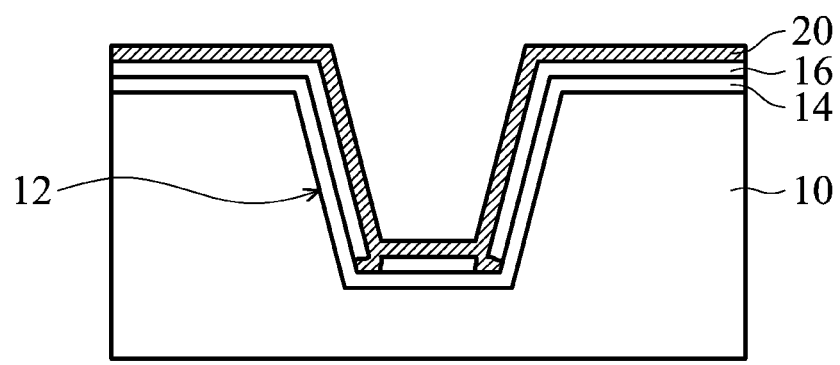
Figure 1E:
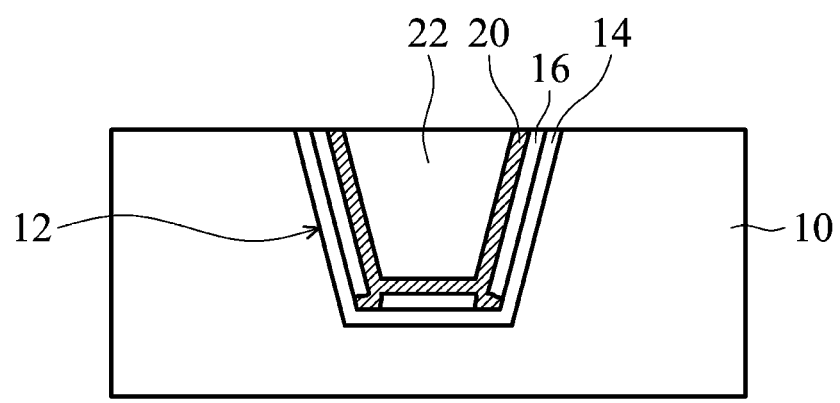

FIG. 1E illustrates a cross section of an exemplary embodiment of a contact plug according to the invention. In the embodiment, the contact plug includes a silicon substrate 10 having at least one opening 12, a titanium layer 14, a first barrier layer 16 and a second barrier layer 20. The titanium layer 14 is conformably formed in the opening 12, the first barrier layer 16 is conformably formed on the titanium layer 14 in the opening 12, and the second barrier layer 20 is conformably formed on the first barrier layer 16 in the opening 12. In one embodiment, a metal layer 22 is formed on the second barrier layer 20 to fill in the opening 12.

FIGS. 1A to 1E illustrates cross sections of an exemplary embodiment of a method for manufacturing a contact plug according to the invention. Referring to FIG. 1A, a silicon substrate 10 having at least one opening 12, such as a contact opening, is provided. In one embodiment, the silicon substrate 10 includes but is not limited to a monocrystalline silicon substrate, an epitaxial silicon substrate, or a silicon-on-insulator (SOI) substrate. In the embodiment, the silicon substrate 10 may contain various integrated circuit devices which electrically connect to other devices via the contact opening 12. In one embodiment, the silicon substrate 10 may contain trench MOSFETs, but the present invention is not limited thereto. For the sake of simplicity, the described integrated circuit devices are not shown in the drawing.

Next, in order to reduce the contact resistance of the contact plug formed later, a doped region (not shown) may be formed in the silicon substrate 10 at the bottom portion of the opening 12 by an ion implantation process. Next, a titanium layer 14 is conformably formed in the opening 12. In one embodiment, the titanium layer 14 may be deposited by chemical vapor deposition (CVD), physical vapor deposition (PVD), ion metal plasma (IMP), self-ionized plasma (SIP), or another suitable deposition process.

Referring to FIG. 1B, a first barrier layer 16 is conformably formed on the titanium layer 14 in the opening 12. In one embodiment, the first barrier layer 16 may include titanium nitride, tantalum nitride, or any known barrier materials. In one embodiment, the first barrier layer 16 may be deposited by CVD, PVD, IMP, SIP, or another suitable deposition process. In one embodiment, the thickness of the first barrier layer is 50 angstroms (Å), and the first barrier layer 16 and the titanium layer 14 are formed in-situ so as to prevent the oxidation of the titanium layer 14 in the ambient environment.

Referring to FIG. 1C, a rapid thermal process (RTP) 18 is performed on the titanium layer 14 and the first barrier layer 16. In one embodiment, the RTP 18 is performed at 500-950°

C. for 10-50 seconds in vacuum. For example, the RTP 18 may be performed at 765° C. for 30 seconds. The RTP 18 is performed to form a titanium silicide layer (not shown) by the reaction between the titanium layer 14 and the silicon substrate 10 around the opening 12 so as to reduce the contact resistance of the contact plug. It is noted that due to the doped region formed in the silicon substrate 10 at the bottom portion of the opening 12, the formation rates of the titanium silicide layer at the sidewall and bottom of the opening 12 are different during the RTP 18. Therefore, stress is induced and the titanium nitride layer at the bottom corner of the opening 12 is torn apart by the stress and cracks are formed therein.

Referring to FIG. 1D, after the performance of the RTP 18, a second barrier layer 20 is conformably formed on the first barrier layer 16 in the opening 12. It is noted that parts of the second barrier layer 20 extend into and fill the cracks of the first barrier layer 16. Therefore, the metal layer 22 formed later (see FIG. 1E) is prevented from diffusing to the exterior through the cracks, and leakage paths are no longer formed. In the embodiment, the second barrier layer 20 may include titanium nitride, tantalum nitride, or any known barrier materials. In the embodiment, the second barrier layer 20 may be formed by CVD, PVD, IMP, SIP, or another suitable deposition process. For example, the second barrier layer is formed by metal organic chemical vapor deposition (MOCVD). In one embodiment, the material of the first barrier layer 16 is the same as that of the second barrier layer 20. For example, the first barrier layer 16 and the second barrier layer are both titanium nitride. In another embodiment, the material of the first barrier layer 16 is different from that of the second barrier layer 20. For example, the first barrier layer 16 is titanium nitride, and the second barrier layer 20 is tantalum nitride. Moreover, in the embodiment, the thickness of the second barrier layer 20 is greater than or equal to that of the first barrier layer 16. For example, the thickness of the first barrier layer 16 is in a range of about 10-150 Å, and the thickness of the second barrier layer 20 is in a range of about 50-500 Å. Therefore, the capability of the second barrier layer 20 to fill in the cracks of the first barrier layer 16 can be improved.

Referring to FIG. 1E, a metal layer 22 is formed on the second barrier layer 20 to fill the opening 12. In one embodiment, the metal layer 22 may include tungsten, which may be formed by a CVD process that introduces hydrogen and $WF_6$ and utilize hydrogen to reduce $WF_6$, such that the opening 12 is fully filled by the tungsten metal layer. In the embodiment, since the cracks of the first barrier layer 16 are filled by the second barrier layer 20, fluorine ions are prevented from passing through the cracks and reacting with the silicon substrate 10. As a result, Si loss at the bottom corner of the contact plug can be eliminated. Next, the excess of the titanium layer 14, the first barrier layer 16, the second barrier 20 and the metal layer 22 above the opening 12 can be removed by an etching back process or a polishing process (e.g., chemical mechanical polishing (CMP)), and the manufacturing is complete.

According to the foregoing embodiments of the manufacturing for the contact plug, the cracks of the first barrier layer 16 formed during the RTP 18 can be filled by the second barrier layer 20, thereby eliminating the formation of the leakage paths of the integrated circuit devices in the silicon substrate 10 at the bottom corner of the contact plug, and leakage current can be dramatically reduced. Moreover, if the manufacturing of the contact plug utilizes gases containing fluorine, fluorine ions are prevented from passing through the cracks of the barrier layer, and therefore Si loss at the bottom corner of the contact plug can also be eliminated.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact plug, comprising:
   a silicon substrate having at least one opening and having a doped region formed therein and at a bottom portion of the opening;
   a titanium layer conformably formed in the opening, such that the titanium layer directly contacts the silicon substrate through the opening;
   a first barrier layer conformably formed on the titanium layer in the opening; and
   a second barrier layer conformably formed on a top surface of the first barrier layer in the opening,
   wherein the second barrier layer fills into the first barrier layer at the bottom corner of the opening from the top surface of the first barrier layer.

2. The contact plug of claim 1, wherein the first barrier layer and the second barrier layer are formed of the same material.

3. The contact plug of claim 1, wherein the first barrier layer and the second barrier layer are formed of different materials.

4. The contact plug of claim 1, wherein the first barrier layer comprises titanium nitride or tantalum nitride.

5. The contact plug of claim 1, wherein the second barrier layer comprises titanium nitride or tantalum nitride.

6. The contact plug of claim 1, wherein the second barrier layer has a thickness greater than that of the first barrier layer.

7. The contact plug of claim 1, wherein the first barrier layer has a thickness in a range of 10-150 Å and the second barrier layer has a thickness in a range of 50-500 Å.

8. The contact plug of claim 1, further comprising a metal layer formed on the second barrier layer to fill the opening.

9. The contact plug of claim 8, wherein the metal layer comprises tungsten.

10. A method for manufacturing a contact plug, comprising:
    providing a silicon substrate having at least one opening and having a doped region formed therein and at a bottom portion of the opening;
    conformably forming a titanium layer in the opening, wherein the titanium layer directly contacts the silicon substrate through the opening;
    conformably forming a first barrier layer on the titanium layer in the opening;
    performing a rapid thermal process on the titanium layer and the first barrier layer; and
    forming a second barrier layer conformably on a top surface of the first barrier layer in the opening after performing the rapid thermal process,
    wherein the second barrier layer fills into the first barrier layer at the bottom corner of the opening from the top surface of the first barrier layer.

11. The method of claim 10, wherein the second barrier layer is formed by metal organic chemical vapor deposition (MOCVD).

12. The method of claim 10, wherein the first barrier layer and the second barrier layer are formed of the same material.

13. The method of claim 10, wherein the first barrier layer and the second barrier layer are formed of different materials.

14. The method of claim 10, wherein the first barrier layer comprises titanium nitride or tantalum nitride.

15. The method of claim 10, wherein the second barrier layer comprises titanium nitride or tantalum nitride.

16. The method of claim 10, wherein the second barrier layer has a thickness greater than that of the first barrier layer.

17. The method of claim 10, wherein the first barrier layer has a thickness in a range of 10-150 Å and the second barrier layer has a thickness in a range of 10-150 Å 50-500 Å.

18. The method of claim 10, further comprising forming a metal layer on the second barrier layer to fill the opening.

19. The method of claim 18, wherein the metal layer comprises tungsten.

20. The method of claim 10, wherein the rapid thermal process is performed at a temperature in a range of 500-950° C. for 10-50 seconds.

21. The method of claim 20, wherein the rapid thermal process is performed at 765° C. for 30 seconds.

\* \* \* \* \*